(12) United States Patent
Lin

(10) Patent No.: US 10,365,682 B1
(45) Date of Patent: Jul. 30, 2019

(54) MULTI-MODE CLOCK TRANSMISSION NETWORK AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/128,551

(22) Filed: Sep. 12, 2018

(51) Int. Cl.
  *G06F 1/04* (2006.01)
  *G06F 1/10* (2006.01)
  *G01R 31/317* (2006.01)
  *H03F 3/45* (2006.01)

(52) U.S. Cl.
  CPC ......... *G06F 1/10* (2013.01); *G01R 31/31727* (2013.01); *H03F 3/45475* (2013.01); *H03F 2203/45288* (2013.01)

(58) Field of Classification Search
  CPC .... H03K 5/135; G06F 1/10; G01R 31/31727; H03F 3/45475; H03F 2203/45288
  See application file for complete search history.

(56) References Cited

U.S. PATENT DOCUMENTS

| 7,973,604 B2 * | 7/2011 | Gamand | H03F 3/607 330/286 |
| 2003/0184384 A1 * | 10/2003 | Orr | H03F 1/565 330/286 |

* cited by examiner

*Primary Examiner* — Long Nguyen
(74) *Attorney, Agent, or Firm* — McClure, Qualey & Rodack, LLP

(57) ABSTRACT

A network including a current-mode transmitter configured to receive a first voltage and output a first current to a first node in accordance with a first control signal. A transmission line is configured to conduct a signal transmission between the first node and a second node, wherein the transmission line comprises an internal tapping point at a third node. A first transimpedance amplifier is configured to receive a second current from the second node and output a second voltage in accordance with a second control signal. Further, a second transimpedance amplifier is configured to receive a third current from the third node and output a third voltage in accordance with a third control signal.

20 Claims, 3 Drawing Sheets

US 10,365,682 B1

MULTI-MODE CLOCK TRANSMISSION NETWORK AND METHOD THEREOF

BACKGROUND OF THE DISCLOSURE

Field of the Disclosure

The present disclosure generally relates to clock transmission, and more particularly to a circuit and method for transmission of a high-speed clock efficiently in a multi-mode application.

Description of Related Art

A clock is a voltage signal that oscillates between a low level and a high level. Clocks are widely used in synchronous digital circuits for coordinating actions of said synchronous digital circuits. An integrated circuit that contains a plurality of synchronous digital circuits usually has a clock generation circuit, e.g. a phase lock loop, configured to generate a clock, which usually needs to be transmitted through a transmission line to said plurality of synchronous digital circuits to coordinate actions thereof. In a case where the clock generation circuit and a synchronous digital circuit that needs to receive the clock from the clock generation circuit are physically separated by a long distance, the transmission of the clock might be challenging. The-long distance transmission of the clock usually suffers a large insertion loss, resulting in a weak signal on the receiving end. The problem worsens when the clock is of a high frequency, since the insertion loss of a transmission line increases as a frequency of the transmitted signal increases.

In some applications, however, a plurality of synchronous digital circuits at different locations need to receive the same high-speed clock. In some cases, besides, a frequency of the clock to be transmitted can be of two substantially frequencies.

What is desired is a method for transmitting a high-speed clock efficiently in a multi-mode application.

SUMMARY OF THE DISCLOSURE

In an embodiment, a network comprises: a current-mode transmitter configured to receive a first voltage and output a first current to a first node in accordance with a first control signal; a transmission line configured to conduct a signal transmission between the first node and a second node, wherein the transmission line comprises an internal tapping point at a third node; a first transimpedance amplifier configured to receive a second current from the second node and output a second voltage in accordance with a second control signal; and a second transimpedance amplifier configured to receive a third current from the third node and output a third voltage in accordance with a third control signal.

In an embodiment, a method comprises: receiving a first voltage; converting the first voltage into a first current using a current-mode transmitter in accordance with a first control signal; launching the first current onto a first end of a transmission line; receiving a second current from a second end of the transmission line; converting the second current to a second voltage using a first transimpedance amplifier in accordance with a second control signal; receiving a third current from an internal tapping point of the transmission line; and converting the third current to a third voltage using a second transimpedance amplifier in accordance with a third control signal.

DETAILED DESCRIPTION OF THIS DISCLOSURE

The present disclosure is directed to clock transmission. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

In a co-pending application of title "Method and apparatus for high speed clock transmission" (U.S. application Ser. No. 15/964,389), the contents of which are incorporated herein by reference, an efficient method for transmitting a high-speed clock to a remote synchronous digital circuit is disclosed.

Persons of ordinary skill in the art understand terms and basic concepts related to microelectronics that are used in this disclosure, such as "circuit node," "power supply node," "ground node," "differential signal," "differential-pair" "voltage," "current," "current source," "NMOS (N-channel metal oxide semiconductor) transistor," "resistor," "inductor," "capacitor," "clock," "signal," "frequency," "amplifier," "common-gate amplifier," "impedance," "transmission line," and "load." Terms and basic concepts like these are apparent to those of ordinary skill in the art and thus will not be explained in detail here. Those of ordinary skill in the art can also recognize a symbol of NMOS transistor, and identify the "source," the "gate," and the "drain" terminals thereof.

This disclosure is presented in an engineering sense, instead of a rigorous mathematical sense. For instance, "A is equal to B" means "a difference between A and B is smaller than an engineering tolerance.

Throughout this disclosure, a ground node is denoted by "$V_{SS}$." A power supply node is denoted by "$V_{DD}$." A clock is a voltage signal that cyclically toggles back and forth between a low level (e.g. the electrical potential at the ground node "$V_{SS}$," or $V_{SS}$ for short) and a high level (e.g., the electrical potential at the power supply node "$V_{DD}$," or $V_{DD}$ for short). By way of example but not limitation, $V_{DD}$ is 1.1V, while $V_{SS}$ is 0V.

Figure 1:
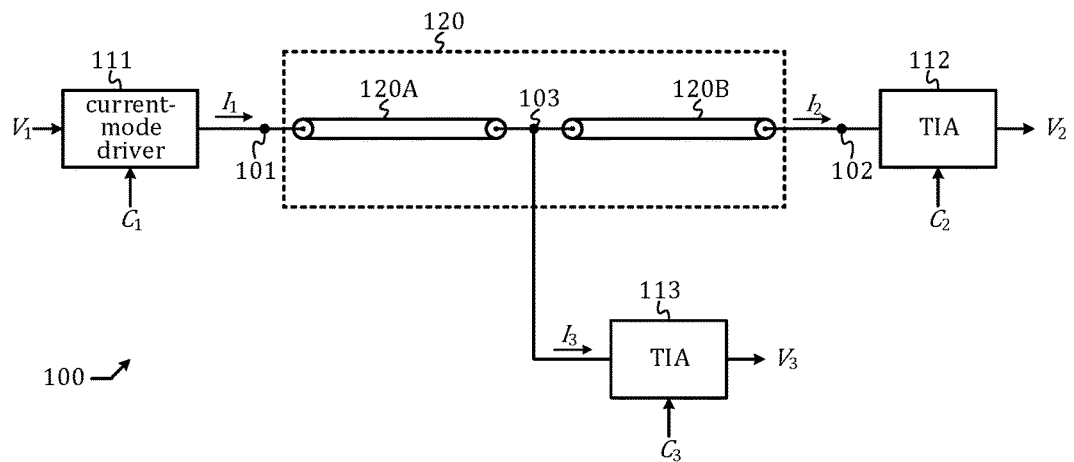
FIG. 1 shows a functional diagram of a clock transmission network in accordance with an embodiment of the present disclosure.

A functional block diagram of a multi-mode clock transmission network 100 is depicted in FIG. 1. The multi-mode clock transmission network 100 comprises: a current-mode driver 111 configured to receive a first voltage $V_1$ and output a first current $I_1$ to a first node 101 in accordance with a first control signal $C_1$; a transmission line 120 configured to conduct a signal transmission between the first node 101 and a second node 102, wherein the transmission line 120 comprises a first section 120A and a second section 120B joined at an internal tapping point at a third node 103; a first TIA (transimpedance amplifier) 112 configured to receive a second current $I_2$ from the second node 102 and output a second voltage $V_2$ in accordance with a second control signal $C_2$; and a second TIA 113 configured to receive a third current $I_3$ from the third node 103 and output a third voltage $V_3$ in accordance with a third control signal $C_3$. In an embodiment, both $C_2$ and $C_3$ are logical signals. When $C_2$ ($C_3$) is asserted, TIA 112 (113) is activated and presents a low input impedance for $I_2$ ($I_3$) to flow in and get converted into $V_2$ ($V_3$); when $C_2$ ($C_3$) is de-asserted, TIA 112 (113) is deactivated and presents a high input impedance to prevent $I_2$ ($I_3$) from flowing in, causing $I_2$ ($I_3$) and thus $V_2$ ($V_3$) to be nearly zero.

In accordance with a state of $C_2$ and $C_3$, three modes can be supported: in a first mode wherein $C_2$ is asserted and $C_3$ is de-asserted, $I_1$ is effectively transmitted into $I_2$ and then converted to $V_2$ while $I_3$ and thus $V_3$ are nearly zero; in a second mode wherein $C_2$ is de-asserted and $C_3$ is asserted, $I_1$ is effectively transmitted into $I_3$ and then converted to $V_3$ while $I_2$ and thus $V_2$ are nearly zero; and in a third mode wherein $C_2$ and $C_3$ are both asserted, $I_1$ is effectively transmitted and split into $I_2$ and $I_3$ and then converted to $V_2$ and $V_3$, respectively. Care must be taken, however, to consider transmission line effect, which causes $I_1$ to be different from $I_2$ plus $I_3$. In any case, multi-mode clock transmission network 100 allows a local clock (i.e. $V_1$) to be transmitted into a remote clock (i.e. $V_2$) at a remote location, or an in-between clock (i.e. $V_3$) at an in-between location, or both.

Figure 2:
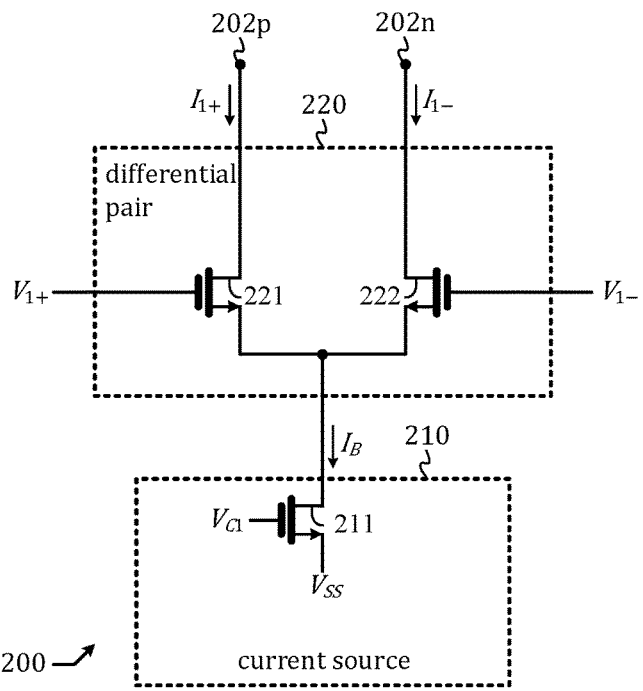
FIG. 2 shows a schematic diagram of a current-mode driver suitable for use in the clock transmission network of FIG. 0.1.

A schematic diagram of a current-mode driver 200 that can be instantiated to embody the current-mode driver 111 of FIG. 1 is depicted in FIG. 2. As illustrated, differential-signaling embodiment is used, wherein the first voltage $V_1$ in FIG. 1 is represented by a difference between a first end $V_{1+}$ and a second end $V_{1-}$, while the first current $I_1$ is represented by a difference between a first branch $I_{1+}$ and a second branch $I_{1-}$. Current-mode driver 200 comprises: a current source 210 configured to establish a bias current $I_B$ in accordance with a control voltage $V_{C1}$; and a differential pair 220 comprising two NMOS transistors 221 and 222 configured to receive $V_{1+}$ and $V_{1-}$ and output $I_{1+}$ and $I_{1-}$ respectively, in accordance with the bias current $I_B$. Due to differential signaling, the first node 101 in FIG. 1 is embodied by two nodes, 202p and 202n, here. The first control signal $C_1$ in FIG. 1 is embodied by the control voltage $V_{C1}$. Current-mode driver 200 is well known in the prior art and thus not described in detail here.

Figure 3:
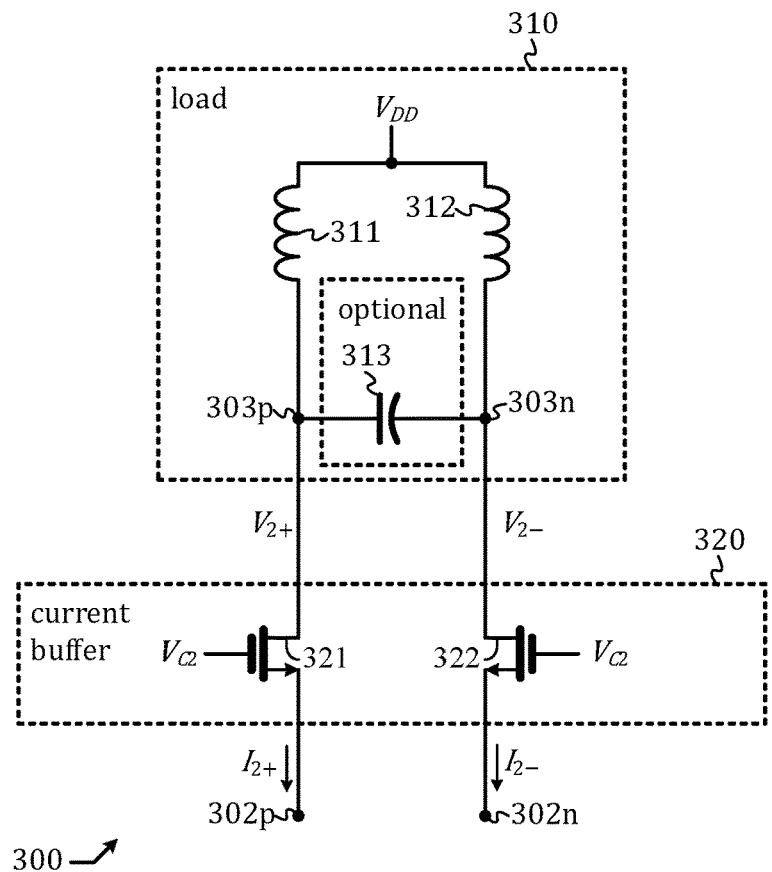
FIG. 3 shows a schematic diagram of a transimpedance amplifier suitable for use in the clock transmission network of FIG. 1.

A schematic diagram of a TIA 300 that can be instantiated to embody TIA 112 is depicted in FIG. 3. Again, differential-signaling embodiment is used, wherein the second voltage $V_2$ in FIG. 1 is represented by a difference between a first end $V_{2+}$ and a second end $V_{2-}$, while the second current $I_2$ is represented by a difference between a first branch $I_{2+}$ and a second branch $I_{2-}$. TIA 300 comprises: a current buffer 320 comprising two NMOS transistors 321 and 322, both of which are configured in common-gate amplifier topology controlled by a control voltage $V_{C2}$; and a load 310 comprising two inductors 311 and 312. In an optional embodiment, a tuning capacitor 313 is inserted between nodes 303p and 303n. Load 310 can provide a large gain at a given frequency, provided inductors 311 and 312 and tuning capacitor 313 are properly chosen to establish a resonance condition at said given frequency.

In an alternative embodiment not shown in figures, inductors 311 and 312 are replaced by two resistors, respectively, and the tuning capacitor 313 is removed. This alternative embodiment has a lower gain, but is more compact in circuit layout and suitable for a low frequency, wide-band application. Such an implementation may be desired in certain circuits. The control voltage $V_{C2}$ embodies the second control signal $C_2$. When $V_{C2}$ is set to $V_{DD}$, TIA 310 is activated, and NMOS transistors 321 and 322 are both turned on and present a low input impedance at nodes 302p and 302n, respectively; when $V_{C2}$ is set to $V_{ss}$, TIA 300 is deactivated, and NMOS transistors 321 and 322 are both turned off and present a high input impedance at nodes 302p and 302n, respectively. Due to differential signaling, the second node 102 in FIG. 1 is embodied by the two nodes 302p and 302n. Note that TIA 300 is just an example but not limitation. Other alternative TIA circuits known in the prior art may be used instead at the discretion of circuit designers, based on objectives of certain circuit configurations or performance objectives. For instance, a TIA circuit that can achieve a lower input impedance is presented in the co-pending application of title "Method and apparatus for high speed clock transmission" (U.S. application Ser. No. 15/964, 389).

TIA 300 can also be instantiated to embody TIA 113 of FIG. 1, by replacing $I_{2+}$, $I_{2-}$, $V_{2+}$, $V_{2-}$, and $V_{c2}$ with $I_{3+}$, $I_{3-}$, $V_{3+}$, $V_{3-}$, and $V_{c3}$, respectively, whereas a difference between $I_{3+}$ and $I_{3-}$ embodies $I_3$, a difference between $V_{3+}$ and $V_{3-}$ embodies $V_3$, and $V_{c3}$ embodies $C_3$.

Figure 4:
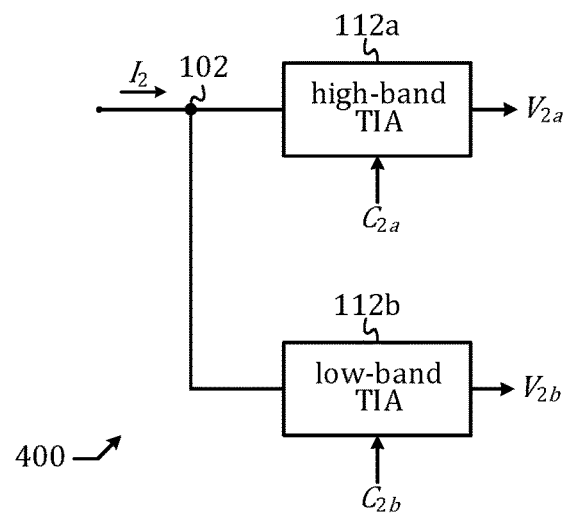
FIG. 4 shows a schematic of an alternative embodiment of a transimpedance amplifier suitable for use in the clock transmission network of FIG. 1.

In some applications, a clock to be transmitted could be of two substantially different frequencies. For instance, the clock's frequency can be either 5 GHz or 12 GHz. In this case, a combination of a high-band TIA 112a and a low-band TIA 112b, as shown in FIG. 4, can be used to embody TIA 112 of FIG. 1. Here, the high-band TIA 112a is controlled by a high-band control signal $C_{2a}$ and designed to have a high gain at a higher frequency, while the low-band TIA 112b is controlled by a low-band control signal $C_{2b}$ and designed to have a high gain at a lower frequency, wherein $C_{2a}$ and $C_{2b}$ jointly embody $C_2$. $C_{2a}$ and $C_{2b}$ will never be asserted at the same time; that is, when $C_{2a}$ is asserted, $C_{2b}$ must be de-asserted, and vice versa. When $C_{2a}$ is asserted, the high-band TIA 112a is turned on and presents a low input-impedance for $I_2$ to flow in and get converted into $V_{2a}$, which is provided to a digital circuit that needs the higher frequency clock. When $C_{2b}$ is asserted, the high-band TIA 112b is turned on and presents a low input-impedance for $I_2$ to flow in and get converted into $V_{2b}$, which is provided to a digital circuit that needs the lower frequency clock. The high-band TIA 112a can be embodied by TIA 300 with the load 310 tuned to have a high gain at, for instance, 12 GHz; the low-band TIA 112b can be embodied by TIA 300 with the load 310 tuned to have a high gain at, for instance, 5 GHz. Note that in this case, $V_{2a}$ and $V_{2b}$ jointly embody $V_2$.

The same principle (of using a combination of a high-band TIA and a low-band TIA) can be applied to TIA 113 of FIG. 1.

Figure 5:
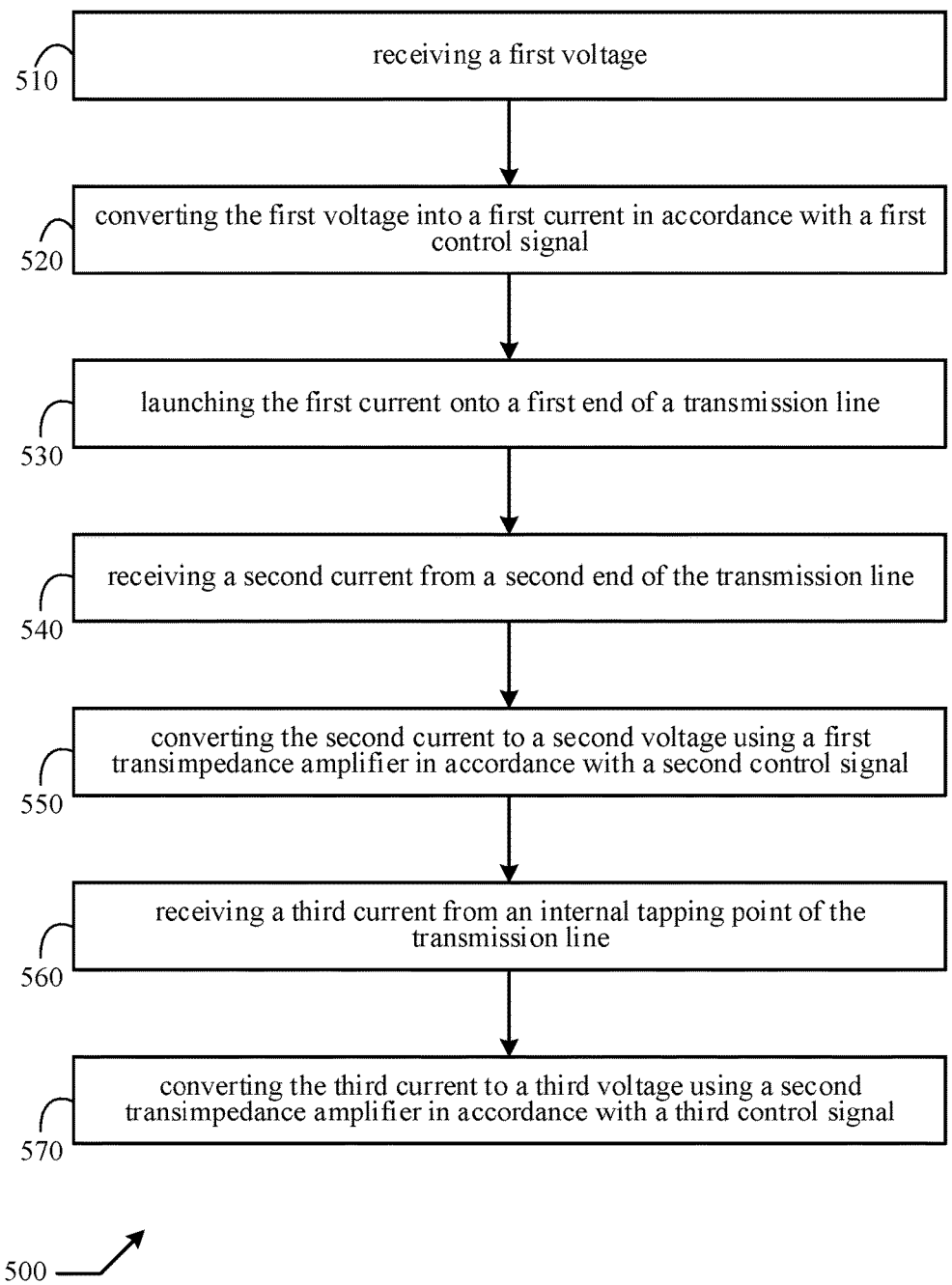
FIG. 5 shows a flow diagram of a method in accordance with an embodiment of the present invention.

As illustrated by a flow diagram 500 shown in FIG. 5 a method in accordance with an embodiment of the present invention comprises the following steps: (step 510) receiving a first voltage; (step 520) converting the first voltage into a first current in accordance with a first control signal; (step 530) launching the first current onto a first end of a transmission line; (step 540) receiving a second current from a second end of the transmission line; (step 550) converting the second current to a second voltage using a first transimpedance amplifier in accordance with a second control signal; (step 560) receiving a third current from an internal tapping point of the transmission line; and (step 570) converting the third current to a third voltage using a second transimpedance amplifier in accordance with a third control signal.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A network comprising:
    a current-mode transmitter configured to receive a first voltage and output a first current to a first node in accordance with a first control signal;
    a transmission line configured to conduct a signal transmission between the first node and a second node, wherein the transmission line comprises an internal tapping point at a third node;
    a first TIA (transimpedance amplifier) configured to receive a second current from the second node and output a second voltage in accordance with a second control signal; and
    a second TIA configured to receive a third current from the third node and output a third voltage in accordance with a third control signal.

2. The network of claim 1, wherein the current-mode transmitter comprises a current source configured to establish a bias current in accordance with the first control signal, and a differential pair configured to output the first current in accordance with the bias current.

3. The network of claim 1, wherein the first TIA comprises a current buffer controlled by the second control signal and a load, while an input pin and an output pin of the current buffer are connected to the second node and the load, respectively.

4. The network of claim 3, wherein the current buffer presents a high input impedance when the second control signal is de-asserted to prevent the second current from flowing in, and presents a low input impedance to allow the second current to flow to the load to establish the second voltage.

5. The network of claim 4, wherein the load comprises an inductor.

6. The network of claim 1, wherein: the second control signal comprises a high-band control signal and a low-band control signal, and the first TIA comprises a high-band TIA and a low-band TIA controlled by the high-band control signal and the low-band control signal, respectively.

7. The network of claim 6, wherein the high-band TIA is of a low input impedance and configured to provide a high gain at a high frequency when the high-band control signal is asserted and of a high input impedance otherwise.

8. The network of claim 7, wherein the low-band TIA is a of low input impedance and configured to provide a high gain at a low frequency when the low-band control signal is asserted and of a high input impedance otherwise.

9. The network of claim 8, wherein the high-band control signal is asserted and the low-band control signal is de-asserted in a high-frequency mode, while the high-band control signal is de-asserted and the low-band control signal is asserted in a low-frequency mode.

10. The network of claim 1, wherein the first TIA and the second TIA are constructed by the same circuit topology.

11. A method comprising:
    receiving a first voltage;
    converting the first voltage into a first current using a current-mode transmitter in accordance with a first control signal;
    launching the first current onto a first end of a transmission line;
    receiving a second current from a second end of the transmission line;
    converting the second current to a second voltage using a first TIA (transimpedance amplifier) in accordance with a second control signal;
    receiving a third current from an internal tapping point of the transmission line; and
    converting the third current to a third voltage using a second TIA in accordance with a third control signal.

12. The method of claim 11, wherein the current-mode transmitter comprises a current source configured to establish a bias current in accordance with the first control signal, and a differential pair configured to output the first current in accordance with the bias current.

13. The method of claim 11, wherein the first TIA comprises a current buffer controlled by the second control signal and a load, while an input pin and an output pin of the current buffer are connected to a second node and the load, respectively.

14. The method of claim 13, wherein the current buffer presents a high input impedance when the second control signal is de-asserted to prevent the second current from flowing in, and presents a low input impedance to allow the second current to flow to the load to establish the second voltage.

15. The method of claim 14, wherein the load comprises an inductor.

16. The method of claim 11, wherein: the second control signal comprises a high-band control signal and a low-band control signal, and the first TIA comprises a high-band TIA and a low-band TIA controlled by the high-band control signal and the low-band control signal, respectively.

17. The method of claim 16, wherein the high-band TIA is of a low input impedance and configured to provide a high gain at a high frequency when the high-band control signal is asserted and of a high input impedance otherwise.

18. The method of claim 17, wherein the low-band TIA is a of low input impedance and configured to provide a high gain at a low frequency when the low-band control signal is asserted and of a high input impedance otherwise.

19. The method of claim 18, wherein the high-band control signal is asserted and the low-band control signal is de-asserted in a high-frequency mode, while the high-band control signal is de-asserted and the low-band control signal is asserted in a low-frequency mode.

20. The method of claim 11, wherein the first TIA and the second TIA are constructed by the same circuit topology.

* * * * *